United States Patent
Tseng (10) Patent No.: US 8,680,672 B2
(45) Date of Patent: Mar. 25, 2014

(54) SEMICONDUCTOR PACKAGE WITH SLEEVE MEMBER AND FAN WHEEL FOR HEAT DISSIPATION

(75) Inventor: Hsiang-Wei Tseng, New Taipei (TW)

(73) Assignee: Amtek Semiconductors Co., Ltd., New Taipei (TW)

( * ) Notice: Subject to any disclaimer, the term of this patent is extended or adjusted under 35 U.S.C. 154(b) by 25 days.

(21) Appl. No.: 13/428,644

(22) Filed: Mar. 23, 2012

(65) Prior Publication Data

US 2013/0049185 A1 Feb. 28, 2013

(30) Foreign Application Priority Data

Aug. 23, 2011 (TW) .............................. 100130072 A (51) Int. Cl.
*H01L 23/34* (2006.01)
(52) U.S. Cl.
USPC ........... 257/712; 257/704; 257/721; 415/176; 415/178; 415/220; 415/229
(58) Field of Classification Search
USPC .......... 257/712, 721; 415/176, 178, 220, 229; 417/423.1, 423.12, 423.7; 361/695, 361/697.46, 679.48, 688, 694
See application file for complete search history.

(56) References Cited

U.S. PATENT DOCUMENTS

| | | | |
|---|---|---|---|
| 6,799,282 | B2 | 9/2004 | Maeda et al. |
| 7,215,548 | B1 | 5/2007 | Wu et al. |
| 7,286,357 | B2 | 10/2007 | Wung et al. |
| 7,345,884 | B2 | 3/2008 | Horng et al. |
| 7,568,517 | B2 | 8/2009 | Hwang et al. |
| 7,884,512 | B2 | 2/2011 | Horng et al. |
| 7,884,523 | B2 | 2/2011 | Horng et al. |
| 8,488,320 | B2 * | 7/2013 | Tseng ........................ 361/695 |

* cited by examiner

*Primary Examiner* — Dung A. Le
(74) *Attorney, Agent, or Firm* — Edwards Wildman Palmer LLP; Peter F. Corless; Steven M. Jensen (57) ABSTRACT

A semiconductor package is provided for carrying a sleeve member and a fan wheel axially coupled to the sleeve member so as to provide a heat dissipating function. The semiconductor package includes: a substrate; a coil module and at least an electronic component disposed on the substrate; and an encapsulant formed on the substrate for encapsulating the coil module and the electronic component so as to prevent the coil module and the electronic component from disturbing air flow generated by the fan wheel during operation, thereby avoiding generation of noises or vibrations.

15 Claims, 7 Drawing Sheets

SEMICONDUCTOR PACKAGE WITH SLEEVE MEMBER AND FAN WHEEL FOR HEAT DISSIPATION

CROSS-REFERENCES TO RELATED APPLICATIONS

This application claims under 35 U.S.C. §119(a) the benefit of Taiwanese Application No. 100130072, filed Aug. 23, 2011, the entire contents of which is incorporated herein by reference.

BACKGROUND OF THE INVENTION

1. Field of the Invention

The present invention relates to semiconductor packages and fabrication methods thereof, and more particularly, to a semiconductor package having a sleeve member and a fan wheel and a fabrication method of the semiconductor package.

2. Description of Related Art

Circuit boards, for example, main boards or motherboards, include electronic components such as central processing units or graphic cards and conductive circuits electrically connecting the electronic components. During operation of the electronic components, heat generated by the electronic components must be dissipated to prevent the electronic components from failing due to overheating. Particularly, in electronic products having more functionalities and higher processing speeds, a large number of electronic components of higher levels are disposed on circuit boards of the electronic products for providing more functionalities and higher processing speeds. Accordingly, more heat is generated by the electronic components, which must be effectively dissipated so as to ensure normal operation of the electronic products.

Generally, heat dissipating fans are mounted on the main boards or motherboards for dissipating heat, as disclosed in U.S. Pat. No. 6,799,282, No. 7,215,548, No. 7,286,357, No. 7,568,517, No. 7,884,512 and No. 7,884,523.

Figure 7A:
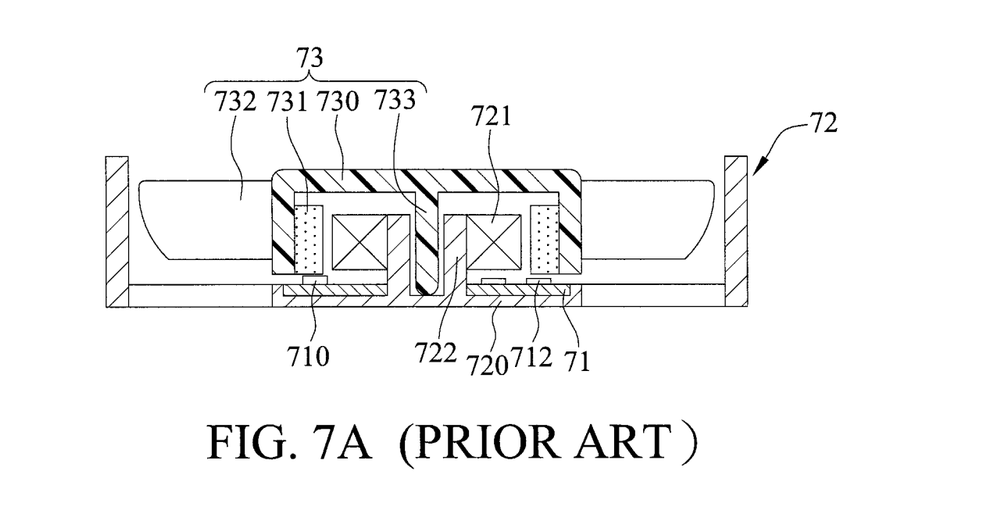
FIG. 7A is a schematic cross-sectional view of a conventional heat dissipating fan.

FIG. 7A shows an example of a conventional heat dissipating fan mounted at a predefined position of a circuit board. The heat dissipating fan mainly consists of a printed circuit board 71, a housing 72 and a fan wheel 73. The housing 72 has a base 720, a sleeve 722 and a coil module 721 disposed around the sleeve 722. The fan wheel 73 has a hub 730, a magnet 731 disposed at an inner side of the hub 730, a plurality of blades 732 disposed around an outer side of the hub 730, and a shaft 733 axially connected to the hub 730 so as to be axially disposed in the sleeve 722. The printed circuit board 71 has at least a control chip 710 and a plurality of passive components 712. The printed circuit board 71 is disposed on the base 720 of the housing 72 such that rotation of the fan wheel 73 can be controlled by the control chip 710. Further, air flow is driven through rotation of the fan wheel 73.

However, since the control chip 710 is located in a narrow gap between the base 720 of the housing 72 and the hub 730 of the fan wheel 73, heat generated by the control chip 710 cannot be effectively dissipated, thus easily causing failing of the control chip 710 due to overheating. Once the control chip 710 fails, the fan wheel 73 cannot be operated by the control chip 710. As such, heat generated by the electronic components on the circuit board cannot be effectively dissipated, which can cause crashes and even damage of the electronic product.

Further, the size of the gap between the hub 730 of the fan wheel 73 and the base 720 of the housing 72 depends on the thickness of the control chip 710. If the thickness of the control chip 710 increases, the size of the gap must be increased, thus adversely affecting reduction of the overall height of the heat dissipating fan. Furthermore, since the circuit board 71 needs to have an increased area for disposing of the control chip 710, in the case the cross-sectional area of the heat dissipating fan is not changed, the blades 732 have a decreased area, thereby adversely affecting the output of air flow and the heat dissipating effect.

Figure 7B:
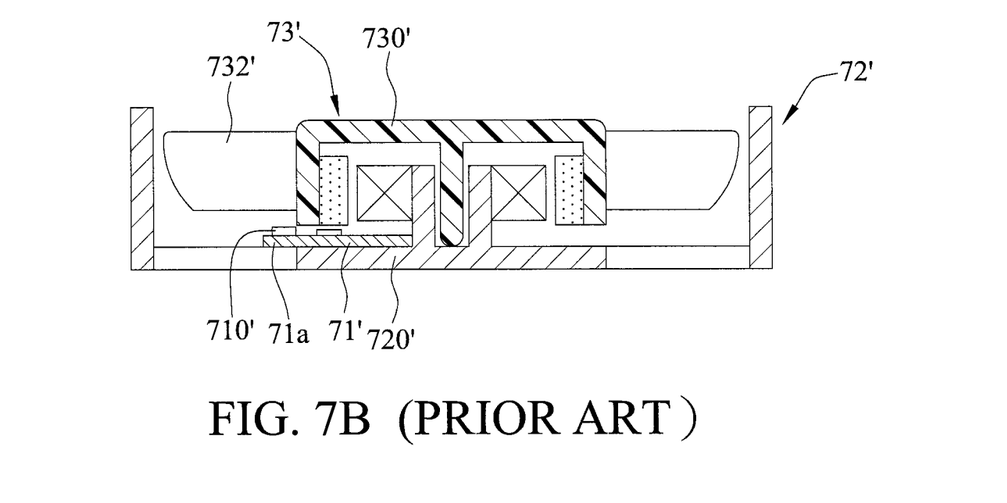
FIG. 7B is a schematic cross-sectional view of a heat dissipating fan disclosed by U.S. Pat. No. 7,345,884.

In view of the above-described drawbacks, U.S. Pat. No. 7,345,884 discloses an improved heat dissipating fan. Referring to FIG. 7B, a printed circuit board 71' is provided, which has an extending portion 71a extending outwards so as for a control chip 710' to be disposed thereon, thereby allowing the control chip 710' to be completely or partially exposed from the gap between a base 720' of a housing 72' and a hub 730' of a fan wheel 73'. As such, heat generated by the control chip 710' can be effectively dissipated through air flow driven by the fan wheel 73'.

However, air flow driven by the fan wheel 73' may be disturbed by the extending portion 71a of the printed circuit board 71' so as to generate noises, thus adversely affecting the performance of the electronic product. Meanwhile, a predefined spacing must be maintained between the blades 732' and the control chip 710', which prevents reduction of the overall height of the heat dissipating fan and cannot meet the miniaturization demand of electronic products.

In addition, the printed circuit board 71' disposed between the hub 730' of the fan wheel 73' and the base 720' of the housing 72' adversely affects the overall height of the heat dissipating fan and prevents miniaturization of the heat dissipating fan.

SUMMARY OF THE INVENTION

Accordingly, the present invention provides a semiconductor package, which comprises: a substrate having a first surface and a second surface opposite to the first surface; a coil module disposed on and electrically connected to the first surface of the substrate; at least an electronic component disposed on and electrically connected to the first surface of the substrate; and an encapsulant formed on the first surface of the substrate for encapsulating the coil module and the at least an electronic component.

The semiconductor package can further comprise a sleeve member disposed in the encapsulant and penetratingly fixed to the substrate and having a top end exposed from the encapsulant. Therein, the sleeve member can be disposed at an off-set position of the semiconductor package.

Further, the semiconductor package can comprise a fan wheel axially connected to the sleeve.

In an embodiment, the semiconductor package can further comprise air holes that are integrally formed and through the encapsulant and the substrate.

In another embodiment, the semiconductor package can further comprise a flow guiding cover secured to the encapsulant and sides of the substrate for enhancing air flow and reducing noises. The flow guiding cover can have an opening formed on an upper side thereof so as to guide the air flow in an axial direction. Alternatively, the flow guiding cover can have a first flow guiding opening in parallel with an axial direction of the sleeve member and a second flow guiding opening in perpendicular to the axial direction of the sleeve member so as to guide air flow in radial direction.

In another embodiment, the semiconductor package can further comprise an external component disposed on and electrically connected to the second surface of the substrate. In another embodiment, the semiconductor package can further comprise conductive elements disposed on the first surface of the substrate and encapsulated by the encapsulant and having top surfaces exposed from the encapsulant, and further comprise an external component disposed on and electrically connected to the conductive elements. Furthermore, the air holes and/or the flow guiding cover can be applied to improve the heat dissipating efficiency of the external component.

The prevent invention further provides a fabrication method of a semiconductor package, which comprises the steps of: providing a substrate having a first surface and a second surface opposite to the first surface, and disposing and electrically connecting a coil module and at least an electronic component to the first surface of the substrate; forming an encapsulant on the first surface of the substrate for encapsulating the coil module and at least an electronic component; and cutting the encapsulant and the substrate so as to obtain a semiconductor package.

The present invention dispenses with the housing of the prior art so as to prevent the electronic component from being disposed between the base of the housing and the hub of the fan wheel, thereby improving the heat dissipating efficiency of the electronic component. Further, the thickness of the encapsulant can be controlled so as to reduce the overall thickness of the semiconductor package having the fan wheel, thereby meeting the miniaturization demand of electronic products. Furthermore, the electronic component can be disposed at a predefined position of the substrate without disturbing air flow generated by the fan wheel, thereby avoiding generation of noises or vibrations. In addition, the substrate can have predefined air holes or air holes can be formed after the encapsulant is formed so as to allow heat generated by the electronic component to be dissipated through an air flow passage below the substrate, thus improving the heat dissipating efficiency.

BRIEF DESCRIPTION OF DRAWINGS

FIGS. 3A and 3B are schematic views showing a semiconductor package having air holes, wherein

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

First Embodiment

FIGS. 1A to 1E' are schematic cross-sectional views showing a fabrication method of a semiconductor package according to the present invention.

Figure 1A:
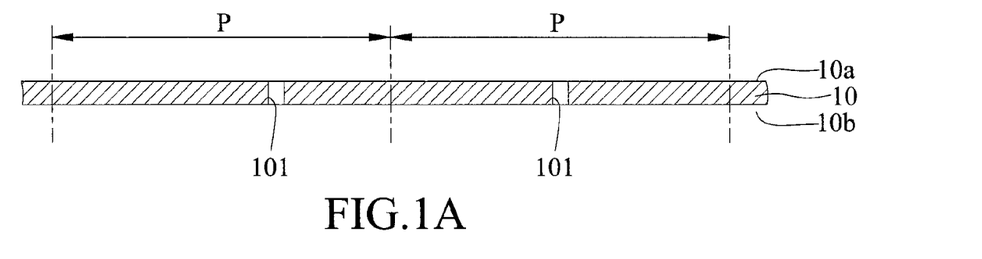
FIGS. 1A to 1E' are schematic cross-sectional views showing a fabrication method of a semiconductor package according to the present invention, wherein FIG. 1C' shows an embodiment of the package structure in which magnetic conductive sheets are disposed on coil modules, and FIG. 1E' shows an embodiment of the package structure in which conductive elements such as solder balls are disposed on a substrate.

Referring to FIG. 1A, a substrate 10 having a first surface 10a and a second surface 10b opposite to the first surface 10a is provided, and a plurality of packaging units P are predefined on the substrate 10. In each of the packaging units, a first positioning hole 101 is formed to penetrate the first surface 10a and the second surface 10b of the substrate 10. The first positioning hole 101 can be formed in the center of the packaging unit P. Alternatively, the first positioning hole 101 can be formed at an off-set position in the packaging unit P so as to leave more space for disposing of electronic components, especially functional chips.

Figure 1B:
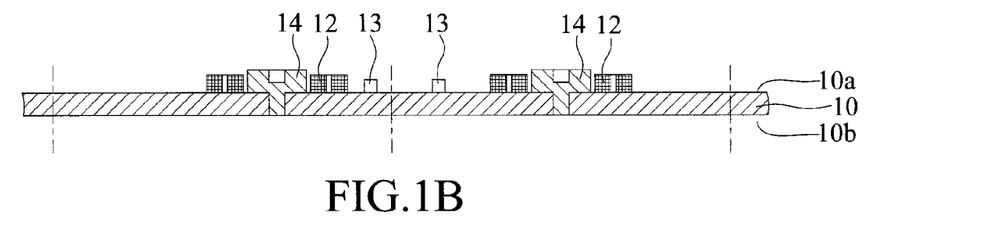

Referring to FIG. 1B, a sleeve member 14 is inserted into the first positioning hole 101, and a coil module 12 and at least an electronic component 13 are disposed on and electrically connected to the first surface 10a of the substrate 10a. The coil module 12 is disposed around an outer periphery of the first positioning hole 101. The at least an electronic component 13 at least includes a control chip and a passive component. Therein, the control chip is used for transmitting control signals to the substrate 10 and the coil module 12 such that a fan wheel to be disposed later can be driven to operate. Referring to FIG. 1B', the electronic component can further include a functional chip 13' such as a graphic chip or a display chip disposed on the first surface 10a of the substrate 10.

Figure 1C:
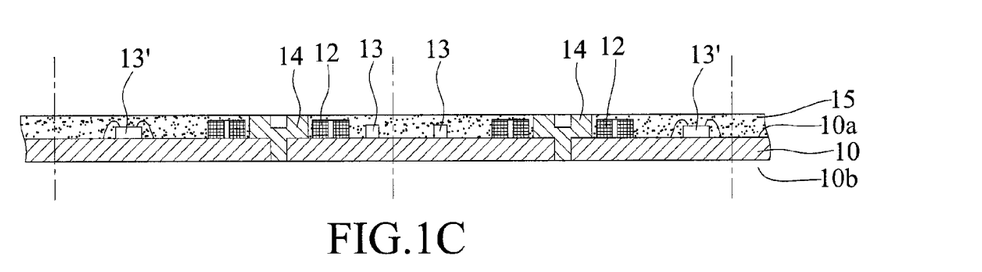

Referring to FIG. 1C, an encapsulant 15 is formed on the first surface 10a of the substrate 10 for encapsulating the coil module 12, the electronic component 13 and side surfaces of the sleeve member 14 while exposing top ends of the sleeve member 14. Further, the encapsulant 15 is 0.05 to 0.2 mm high above the coil module 12 so as to facilitate generation of magnetic flux between the coil module 12 and a magnet of the fan wheel to be disposed later.

Figure 1D:
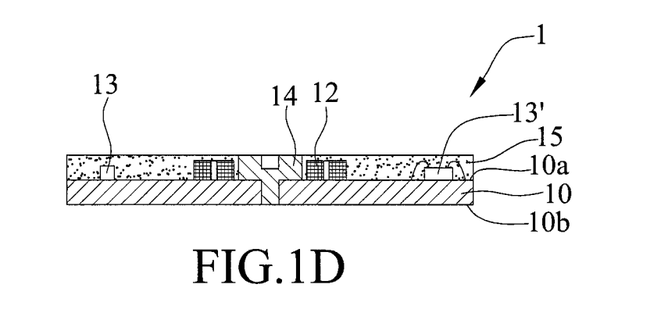

Referring to FIG. 1D, the encapsulant 15 and the substrate 10 are cut to form a plurality of singulated semiconductor packages 1.

Referring to FIG. 1C', a magnetic conductive sheet 18 can be further disposed on an upper end of the coil module 12 and exposed from the encapsulant 15 so as to facilitate generation of magnetic flux between the coil module 12 and the magnet of the fan wheel to be disposed later.

Figure 1E:
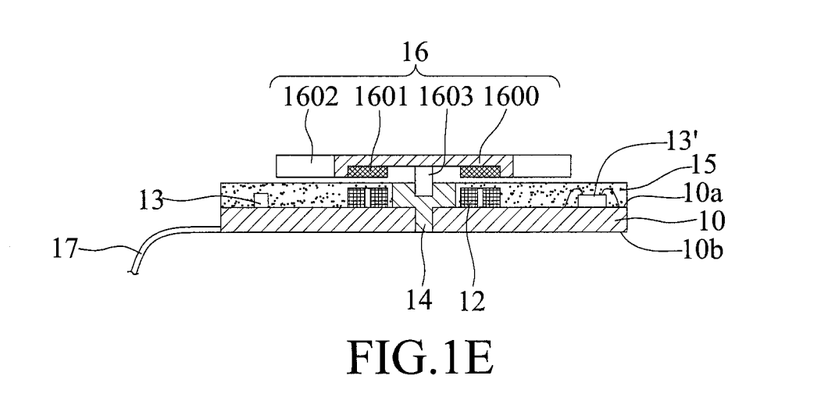

Referring to FIG. 1E, a fan wheel 16 is freely rotatable and axially connected to the sleeve member 14. The fan wheel 16 has a hub 1600, a plate magnet 1601 disposed at a lower side of the hub 1600, a plurality of blades 1602 disposed at an outer side of the hub 1600, and a shaft 1603 axially connected to the hub 1600. Referring to FIGS. 1E and 1E', the substrate 10 further has conductive elements such as conductive lines 17 or solder balls 17' disposed thereon for electrically connecting the substrate 10 to an external device.

Second Embodiment

Figure 2A:
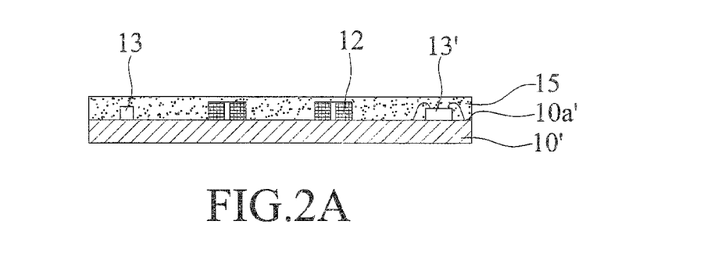
FIGS. 2A to 2C are schematic cross-sectional views showing a fabrication method of a semiconductor package according to a second embodiment of the present invention.
Figure 2B:
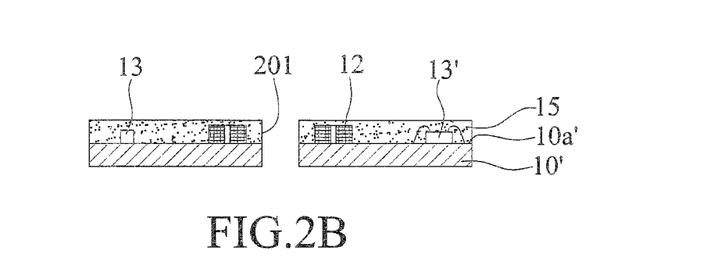
Figure 2C:
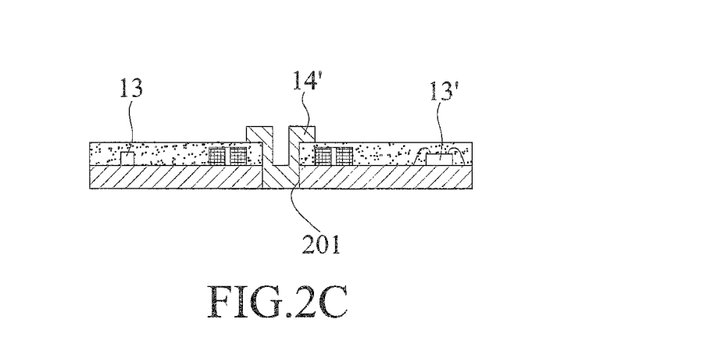

FIGS. 2A to 2C are schematic cross-sectional views showing a fabrication method of a semiconductor package according to a second embodiment of the present invention. The fabrication method of the present embodiment is similar to that of the first embodiment. The difference therebetween is that the positioning hole of the present embodiment is formed after the encapsulant is formed instead of being predefined in the substrate as in the first embodiment. For the sake of simplicity, steps similar to those of the first embodiment are omitted herein.

Referring to FIG. 2A, a coil module 12 and at least an electronic component 13 are disposed on and electrically connected to a first surface 10$a$' of a substrate 10', and an encapuslant 15 is formed on the substrate 10'.

Referring to FIG. 2B, a second positioning hole 201 formed by such as laser drilling penetrates the substrate 10' and the encapsulant 15.

Referring to FIG. 2C, a sleeve member 14' is inserted and secured in the second positioning hole 201. Similarly, the second positioning hole can be formed at an off-set position in the substrate and the encapsulant of the semiconductor package (not shown).

Third Embodiment

Figure 3A:
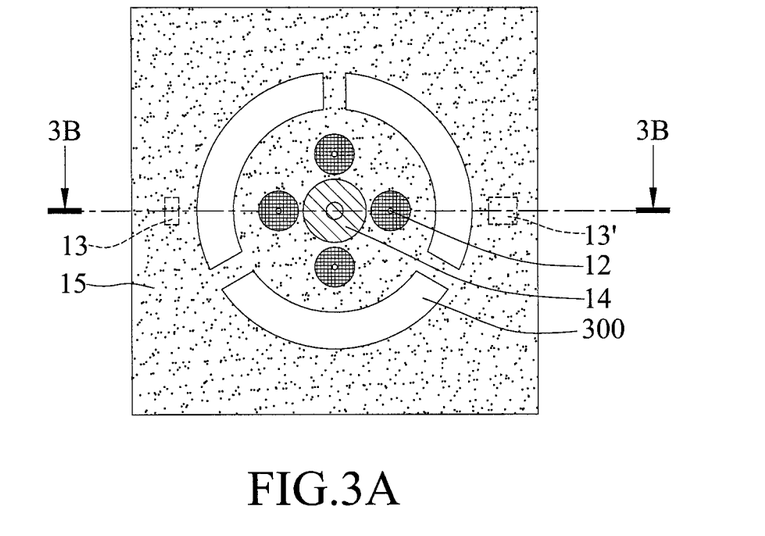

The present embodiment further provides a fabrication method of a semiconductor package having improved heat dissipating efficiency. FIG. 3A is a top view of a semiconductor package of the present embodiment. Referring to FIG. 3A, continued from FIG. 1C or FIG. 2A, after the encapsulant 15 is formed, air holes 300 are formed by such as laser cutting to penetrate the encapsulant 15 and the substrate 10, 10'.

Figure 3B:
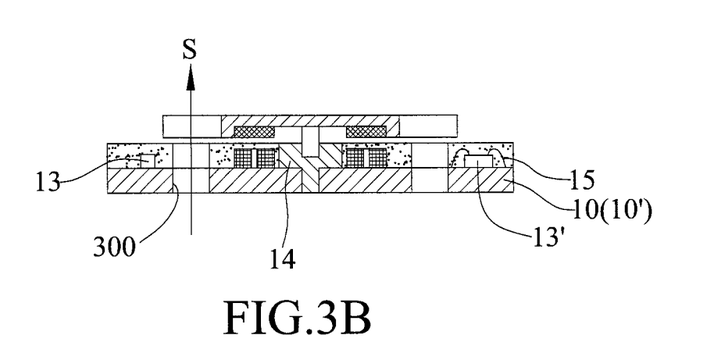
FIG. 3B is a cross-sectional view along a line 3B-3B of FIG. 3A and shows an air flow direction after a fan wheel is disposed on the semiconductor package.

Referring to FIG. 3B, during operation of the semiconductor package, air enters into the air holes from the bottom of the semiconductor package so as to form air flow S, thereby improving the heat dissipating efficiency.

Fourth Embodiment

Figure 4A:
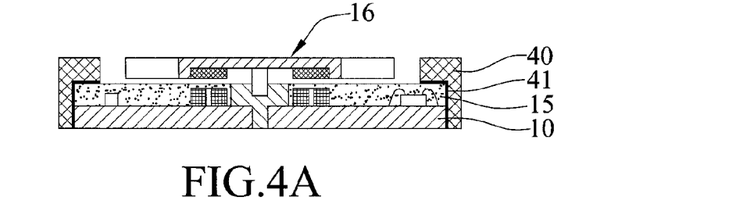
FIGS. 4A, 4A' and 4B are schematic views showing a semiconductor package having axial-flow type and radial direction type flow guiding covers, wherein FIG. 4B' is a cross-sectional view along a line 4B'-4B' of FIG. 4B.

The present invention further provides a fabrication method of a semiconductor package having enhanced air flow so as to reduce noises. Referring to FIG. 4A, which is continued from the semiconductor package of FIG. 1E, a flow guiding cover 40 is secured to sides of the encapsulant 15 and the substrate 10 through an adhesive 41 so as to guide the air flow along a radial direction of the fan wheel 16. Alternatively, the flow guiding cover 40 can be secured in a mechanical manner, as shown in FIG. 4A'.

Figure 4B:
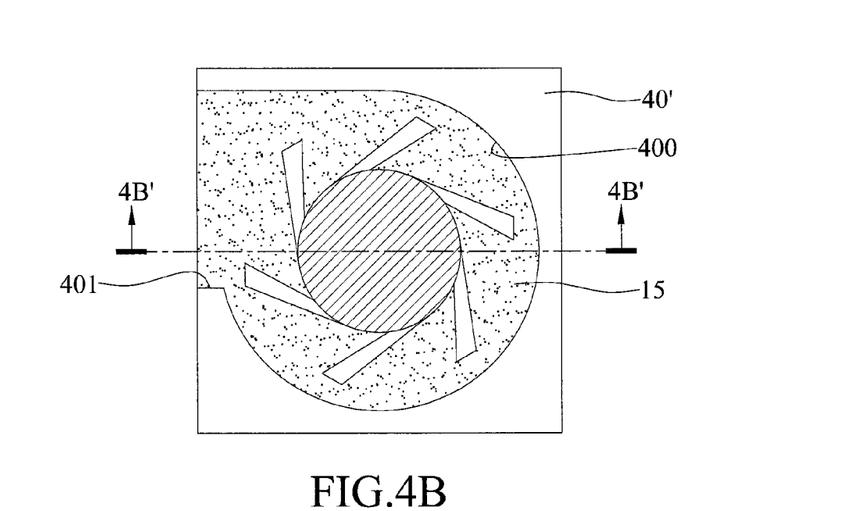

Referring to FIGS. 4B and 4B', a flow guiding cover 40' has a first flow guiding opening 400 in parallel with an axial direction of the sleeve member 14 and a second flow guiding opening 401 in perpendicular to the axial direction of the sleeve member 14. In particular, if the semiconductor package does not have the air holes of the third embodiment, the flow guiding cover 40' of FIGS. 4B and 4B' can be used to guide top-intake air flow S in radial direction.

Fifth Embodiment

Figure 5:
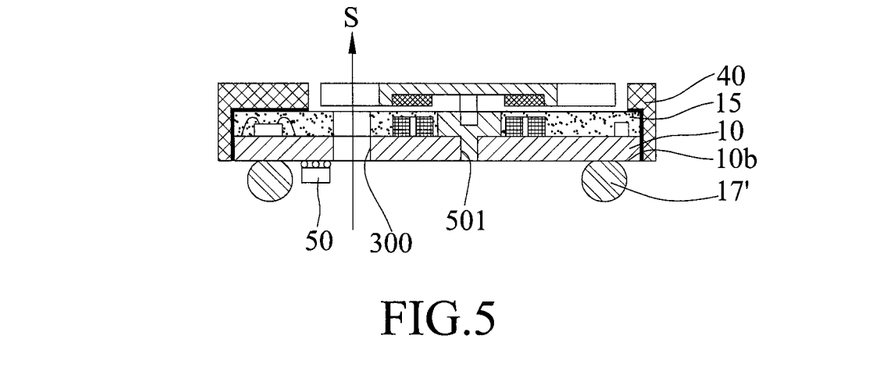
FIG. 5 is a schematic cross-sectional view showing a semiconductor package having an external component disposed on a bottom surface of the substrate.

The present invention further provides a semiconductor package in which an external component is disposed on a bottom surface of a substrate. Referring to FIG. 5, air holes 300 (same as in the third embodiment) are provided and a positioning hole 501 is formed at an off-set position of the substrate 10. Before cutting the encapsulant 15 and the substrate 10, the present embodiment disposes and electrically connects an external component 50 to the second surface 10$b$ of the substrate 10. Therein, the external component 50 can be a packaged component or a semiconductor chip. Further, after the package structure is singulated, a flow guiding cover 40 can be secured to the singulated semiconductor package for guiding air flow S.

Sixth Embodiment

Figure 6A:
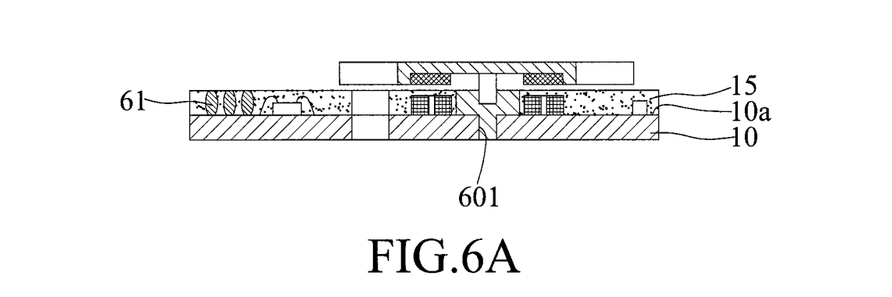
FIGS. 6A and 6B are schematic cross-sectional views showing a method for disposing an external component on a top surface of an encapsulant.

The present invention further provides a semiconductor package in which an external component is disposed on a top surface of an encapsulant. Referring to FIG. 6A, a positioning hole 601 is formed at an off-set position in the substrate 10. In the present embodiment, before forming the encapsulant 15, conductive elements 61 such as solder balls or metal columns are formed on the first surface 10$a$ of the substrate 10.

Figure 6B:
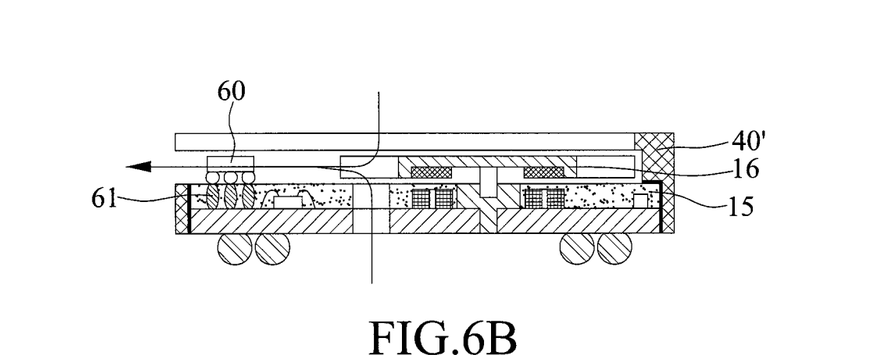

Referring to FIG. 6B, top surfaces of the conductive elements 61 are exposed from the encapsulant 15 so as for an external component 60 to be disposed thereon. Preferably, a flow guiding cover 40' for guiding the air flow S in a radial direction, as shown in FIGS. 4B and 4B', can be secured to the semiconductor package.

According to the above-described fabrication method, the present invention further provides a semiconductor package, which has: a substrate 10, 10' having opposite first surface 10$a$, 10$a$' and second surface 10$b$; a coil module 12 disposed on and electrically connected to the first surface 10$a$, 10$a$'; at least an electronic component 13 disposed on and electrically connected to the first surface 10$a$, 10$a$'; and an encapsulant 15 formed on the first surface 10$a$, 10$a$' for encapsulating the coil module 12 and the electronic component 13.

The semiconductor package can further have a sleeve member 14, 14' disposed in the encapsulant 15 and penetratingly fixed to the substrate 10, 10', and having a top end exposed from the encapsulant 15.

Further, the semiconductor package can have a fan wheel 16 axially connected to the sleeve member 14, 14'.

In an embodiment, the semiconductor package can have air holes 300 penetrating the encapsulant 15 and the substrate 10, 10'.

In another embodiment, the semiconductor package can further have flow guiding covers 40, 40' secured to side surfaces of the encapsulant 15 and the substrate 10, 10' for enhancing air flow, thereby reducing noises. The flow guiding cover 40 has an opening formed at an upper side thereof for guiding air flow in an axial direction. The flow guiding cover 40' has a first flow guiding opening 400 in parallel with an axial direction of the sleeve member 14, 14' and a second flow guiding opening 401 in perpendicular to the axial direction of the sleeve member 14 so as to provide air flow in a radial direction.

In another embodiment, the semiconductor package can further have an external component 50 disposed on and electrically connected to the second surface (bottom surface) of the substrate 10, 10'. In an alternative embodiment, the semiconductor package can have conductive elements 61 disposed on the first surface (top surface) of the substrate 10, 10' and encapsulated by the encapsulant 15 and having top surfaces exposed from the encapsulant 15, and an external components 60 disposed on and electrically connected to the conductive elements 61. Furthermore, the air holes and/or the flow guiding covers can be applied for improving the heat dissipating efficiency of the external component.

The present invention dispenses with the housing of the prior art so as to prevent the electronic component from being disposed between the base of the housing and the hub of the fan wheel, thereby improving the heat dissipating efficiency of the electronic component. Further, the thickness of the encapsulant can be controlled so as to reduce the overall thickness of the semiconductor package having the fan wheel, thereby meeting the miniaturization demand of electronic products. Furthermore, the control chip can be disposed at a predefined position of the substrate without disturbing air flow generated by the fan wheel, thereby avoiding generation of noises or vibrations. In addition, the substrate can have predefined air holes or air holes can be formed after the encapsulant is formed so as to allow heat generated by the electronic component to be dissipated through an air flow passage below the substrate, thus improving the heat dissipating efficiency.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
    a substrate having a first surface and a second surface opposite to the first surface;
    a coil module disposed on and electrically connected to the first surface of the substrate;
    at least an electronic component disposed on and electrically connected to the first surface of the substrate; and
    an encapsulant formed on the first surface of the substrate for encapsulating the coil module and the at least an electronic component.

2. The package of claim 1, further comprising a sleeve member disposed in the encapsulant and penetratingly fixed to the substrate and having a top end exposed from the encapsulant.

3. The package of claim 2, wherein the sleeve member is disposed at an off-set position of the semiconductor package.

4. The package of claim 2, further comprising a fan wheel axially connected to the sleeve member.

5. The package of claim 4, wherein the fan wheel has a hub, a plate magnet disposed at a lower side of the hub, a plurality of blades disposed at an outer side of the hub, and a shaft axially connected to the hub.

6. The package of claim 1, further comprising a magnetic conductive sheet disposed on the coil module and exposed from the encapsulant.

7. The package of claim 1, further comprising conductive elements disposed on the substrate for electrically connecting an external device.

8. The package of claim 1, wherein the at least an electronic component comprises a control chip and a passive component.

9. The package of claim 8, wherein the control chip is used for transmitting control signals to the substrate and the coil module.

10. The package of claim 8, wherein the electronic component further comprises a functional chip disposed on the first surface of the substrate and embedded in the encapsulant.

11. The package of claim 1, further comprising air holes penetrating the encapsulant and the substrate.

12. The package of claim 1, further comprising conductive elements disposed on the first surface of the substrate and encapsulated by the encapsulant and having top surfaces exposed from the encapsulant, and further comprising an external component disposed on and electrically connected to the conductive elements.

13. The package of claim 12, wherein the external component is a packaged component or a semiconductor chip.

14. The package of claim 1, further comprising a flow guiding cover secured to the encapsulant and side surfaces of the substrate.

15. The package of claim 14, wherein the flow guiding cover is adhesively or mechanically secured to the encapsulant and the side surfaces of the substrate.

* * * * *